(12) United States Patent
Kinoshita et al.

(10) Patent No.: US 9,305,770 B2
(45) Date of Patent: Apr. 5, 2016

(54) METHOD AND APPARATUS FOR LIQUID TREATMENT OF WAFER-SHAPED ARTICLES

(71) Applicants: Kei Kinoshita, Villach (AT); Keisuke Sato, Villach (AT)

(72) Inventors: Kei Kinoshita, Villach (AT); Keisuke Sato, Villach (AT)

(73) Assignee: LAM RESEARCH AG, Villach (AT)

( * ) Notice: Subject to any disclaimer, the term of this patent is extended or adjusted under 35 U.S.C. 154(b) by 0 days.

(21) Appl. No.: 14/455,629

(22) Filed: Aug. 8, 2014

(65) Prior Publication Data

US 2014/0349489 A1 Nov. 27, 2014

Related U.S. Application Data

(62) Division of application No. 13/471,666, filed on May 15, 2012, now abandoned.

(51) Int. Cl.
| | |
|---|---|
| H01L 21/02 | (2006.01) |
| H01L 21/306 | (2006.01) |
| H01L 21/687 | (2006.01) |
| H01L 21/67 | (2006.01) |

(52) U.S. Cl.
CPC .... *H01L 21/02057* (2013.01); *H01L 21/30604* (2013.01); *H01L 21/6708* (2013.01); *H01L 21/6715* (2013.01); *H01L 21/67051* (2013.01); *H01L 21/68714* (2013.01)

(58) Field of Classification Search
None
See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 6,357,457 B1 * | 3/2002 | Taniyama et al. | 134/57 R |
| 6,485,531 B1 | 11/2002 | Schob | |
| 6,536,454 B2 * | 3/2003 | Lindner | 134/153 |
| 6,615,854 B1 * | 9/2003 | Hongo et al. | 134/148 |
| 7,172,979 B2 * | 2/2007 | Hongo et al. | 438/782 |
| 7,722,736 B2 * | 5/2010 | Miya | 156/345.17 |
| 2004/0084144 A1 * | 5/2004 | Yokouchi et al. | 156/345.11 |
| 2004/0250839 A1 * | 12/2004 | Robertson et al. | 134/33 |
| 2006/0021636 A1 * | 2/2006 | Miya | 134/33 |
| 2007/0012339 A1 * | 1/2007 | Fukuda et al. | 134/26 |
| 2007/0141951 A1 * | 6/2007 | Naoki et al. | 451/5 |
| 2008/0293253 A1 * | 11/2008 | Itzkowitz | 438/745 |
| 2008/0314870 A1 * | 12/2008 | Inoue et al. | 216/38 |
| 2010/0083986 A1 * | 4/2010 | Kamikawa et al. | 134/18 |
| 2010/0200163 A1 * | 8/2010 | Puggi et al. | 156/345.21 |
| 2010/0200547 A1 * | 8/2010 | Higashijima et al. | 216/92 |
| 2010/0206481 A1 * | 8/2010 | Gigacher et al. | 156/345.21 |
| 2012/0111373 A1 * | 5/2012 | Arima et al. | 134/30 |
| 2012/0186607 A1 * | 7/2012 | Higashijima et al. | 134/30 |
| 2013/0152971 A1 * | 6/2013 | Kato | 134/21 |

FOREIGN PATENT DOCUMENTS

| | | |
|---|---|---|
| WO | 2007/101764 A1 | 9/2007 |
| WO | 2009/027194 A1 | 3/2009 |

\* cited by examiner

*Primary Examiner* — Allan Olsen

(74) *Attorney, Agent, or Firm* — Young & Thompson

(57) ABSTRACT

An apparatus for treating a wafer-shaped article, comprises a spin chuck for holding a wafer-shaped article in a predetermined orientation, a liquid dispenser for dispensing a treatment liquid onto a downwardly facing surface of a wafer-shaped article when positioned on the spin chuck, and a gas dispenser for dispensing a gas within a gap defined between the downwardly-facing surface of the wafer-shaped article and an upper surface of the spin chuck.

6 Claims, 2 Drawing Sheets

METHOD AND APPARATUS FOR LIQUID TREATMENT OF WAFER-SHAPED ARTICLES

BACKGROUND OF THE INVENTION

1. Field of the Invention

The invention relates generally to methods and apparatus for liquid treatment of wafer-shaped articles, such as semiconductor wafers, wherein one or more process liquids are dispensed onto a surface of the wafer-shaped article.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531.

Ordinarily, treatment fluids, especially etching liquids, are dispensed from above onto the upper surface of a rotating wafer which faces away from the chuck. In some instances, as described for example in International Publication No. WO 2009/027194, gas is directed to the opposite back surface, which faces the chuck, to provide a gas cushion between the wafer and the chuck which secures the wafer using the Bernoulli-Effect and/or limits treatment liquid dispensed on the front surface of the wafer from flowing around the wafer's edge to the back surface of the wafer. As is further described in International Publication No. WO 2009/027194, a rinsing liquid may be directed to the back surface of the wafer to remove residues of treatment liquid that may have reached the peripheral region of the back surface of the wafer.

With increasing miniaturization of devices and features fabricated on semiconductor wafers, processing those wafers in an uncontrolled open environment becomes more problematic. For example, when wafers undergo wet processing in stations that are open to the surrounding air, the oxygen content of the air causes unwanted corrosion of copper on the front side of the wafer.

During processing of a single wafer in an open environment the oxygen from the air can diffuse through the liquid layer on the wafer to the wafer surface, leading to copper oxidation and therefore copper loss. This effect is enhanced where the liquid layer is very thin, e.g. at the wafer edge.

Furthermore, mechanical and fluid forces acting across the surface of a wafer during processing in an uncontrolled open environment can lead to pattern collapse, distortion or other damage to various devices and features fabricated on the surface of the wafer.

Pattern collapse can occur, for example, when the surface tension of a liquid moving radially outwardly across the surface of a rotating wafer applies a damaging or destructive force to the submicroscopic structures formed on the wafer surface. The problem of pattern collapse becomes more serious as the diameter of semiconductor wafers increases and as the aspect ratio of the submicroscopic structures increases.

The application and removal of treatment liquids in an uncontrolled open environment also leads to the creation of watermarks on the surface of the wafer.

SUMMARY OF THE INVENTION

The present inventors have developed new and improved processes and apparatus for providing a process liquid for liquid treatment of wafer-shaped articles, in which the process liquid is directed to the back surface of a wafer-shaped article, within a space formed between the back surface of the article and a chuck that supports the article during processing, wherein the back surface of the article is maintained in a controlled environment during the liquid treatment.

The present inventors have surprisingly discovered that the present method and apparatus effectively reduce the above-described negative consequences associated with oxygen, as well as reducing pattern loss and formation of watermarks.

Thus, the invention in one aspect relates to an apparatus for treating a wafer-shaped article, comprising a spin chuck for holding a wafer-shaped article in a predetermined orientation wherein a lower surface of the wafer-shaped article, when positioned on the spin chuck, is downwardly-facing and spaced a predetermined distance from an upper surface of the spin chuck, thereby defining a gap between the lower surface of the wafer-shaped article and the upper surface of the spin chuck, a lower gas dispenser located and configured for dispensing gas at least to an annular region of the gap defined by the upper surface of the spin chuck and the lower surface of a wafer-shaped article when positioned on the spin chuck, and at least one lower liquid dispenser located and configured for dispensing liquid onto a downwardly facing surface of a wafer-shaped article when positioned on the spin chuck, wherein the at least one lower liquid dispenser is operatively connected to at least two different liquid sources for subsequently dispensing two different liquids onto a downwardly facing surface of a wafer-shaped article when positioned on the spin chuck.

In preferred embodiments of the apparatus according to the present invention, the spin chuck further comprises a peripheral series of upwardly projecting gripping elements positioned so as to be engageable with a peripheral edge of a wafer-shaped article to be held by the spin chuck, each of the upwardly projecting gripping elements being pivotable about an axis parallel to an axis of rotation of the spin chuck.

In preferred embodiments of the apparatus according to the present invention, the lower gas dispenser comprises a plurality of annularly arranged gas nozzles.

In preferred embodiments of the apparatus according to the present invention, the lower gas dispenser comprises an annular gas nozzle.

In preferred embodiments of the apparatus according to the present invention, the at least one lower liquid dispenser comprises two lower liquid dispensers, each terminating at a same liquid nozzle.

In preferred embodiments of the apparatus according to the present invention, the at least one lower liquid dispenser comprises two lower liquid dispensers, each terminating at a different liquid nozzle.

In preferred embodiments, the apparatus according to the present invention further comprises an upper dispenser positioned and configured for dispensing liquid or gas onto an upwardly facing surface of a wafer-shaped article when positioned on the spin chuck.

Preferably, the different liquid sources include an etching liquid source and a rinsing liquid source.

In preferred embodiments of the apparatus according to the present invention, the at least one lower liquid dispenser comprises two lower liquid dispensers, each terminating at a different liquid nozzle, and the different liquid sources include an etching liquid source and a rinsing liquid source.

In another aspect, the present invention provides a process for treating a wafer-shaped article, comprising positioning a wafer-shaped article on a spin chuck in a predetermined orientation wherein a lower surface of the wafer-shaped article is downwardly-facing and spaced a predetermined distance from an upper surface of the spin chuck thereby defining a gap between the lower surface of the wafer-shaped article and the upper surface of the spin chuck, dispensing a treatment liquid onto the lower surface of the wafer-shaped article while rotating the wafer-shaped article, and dispensing a gas at least to an annular region of the gap defined by the lower surface of the wafer-shaped article and the upper surface of the spin chuck.

In preferred embodiments of the process according to the present invention, the steps of dispensing a treatment liquid and dispensing a gas are at least partly performed concurrently.

In preferred embodiments of the process according to the present invention, the treatment liquid is an etching liquid.

Preferably, the etching liquid is dilute hydrogen fluoride.

In preferred embodiments of the process according to the present invention, the process further comprises dispensing a rinsing liquid onto the lower surface of the wafer-shaped article while rotating the wafer-shaped article, and dispensing a gas into the gap defined by the lower surface of the wafer-shaped article and the upper surface of the spin chuck.

In preferred embodiments of the process according to the present invention, the steps of dispensing a rinsing liquid and dispensing a gas are at least partly performed concurrently.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
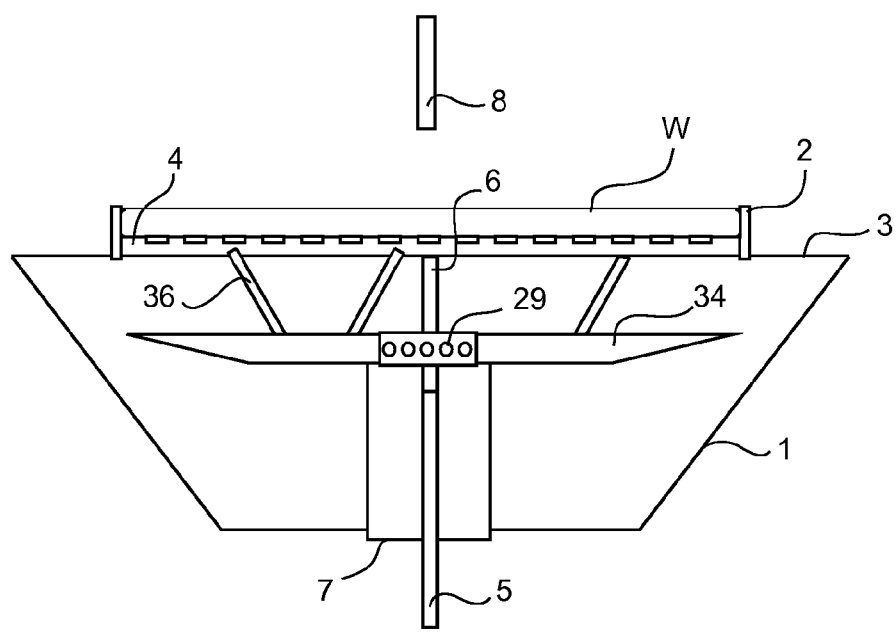
FIG. 1 is a schematic representation of an apparatus according to an embodiment of the present invention.

In FIG. 1, an apparatus according to the invention comprises a rotatable chuck 1 adapted to support a semiconductor wafer W for single wafer wet processing. For example, chuck 1 may include gripping fingers 2 extending upwardly from an upper surface 3 which engage the peripheral edge of a wafer W to position the wafer a fixed distance above the chuck's surface 3. Thus, in use, a gap 4 exists between the lower (back) surface of a wafer and the upper surface 3 of the chuck 1.

A treatment liquid dispenser comprises liquid conduit 5 which extends axially through a central bore in chuck 1 to a liquid nozzle 6 located at or within gap 4. Liquid conduit 5 and liquid nozzle 6 are adapted to conduct one or more treatment liquids to the back surface of a wafer, preferably while the wafer W and chuck 1 are rotating. Additional liquid conduits may extend through chuck 1 to a common liquid nozzle 6 or to additional liquid nozzles located at or within gap 4, as is further described below.

A gas dispenser includes conduit 7 which extends axially through a central bore in chuck 1, preferably but not necessarily about the liquid conduit 5, terminating with a gas distributor configured to dispense gas within gap 4.

In the embodiment shown in FIG. 1, the gas distributor comprises a plurality of branch conduits 29 fluidly connected to conduit 7 and leading to an annular gas distribution chamber 34, which in turn is fluidly connected to gap 4 through a plurality of gas nozzles 36. Nozzles 36 can be uniformly or randomly distributed over the upper surface 3 of chuck 1. Preferably, nozzles 36 are annularly arranged and located at the surface 3 of chuck 1 at least 2 cm outwardly from the central axis of the spin chuck and at least 5 mm inwardly from the edge of a wafer when positioned on the spin chuck. Alternatively, a single annular gas nozzle may be provided, in which case the annular gas nozzle preferably is located at least 4 cm outwardly from the central axis of the spin chuck and at least 1 cm inwardly from the edge of a wafer when positioned on the spin chuck.

A dispenser 8 is optionally provided opposite the upper surface 3 of chuck 1 such that gas and/or liquid may be dispensed onto the upper (front) surface of a wafer W mounted on chuck 1.

Liquid conduit 5, gas conduit 7 and optionally dispenser 8 may be configured to operate selectively, and preferably concurrently, during a wafer treatment process. Accordingly, a treatment liquid delivered by liquid nozzle 6 can effectively be bounded from below by gas which is delivered via nozzles 36 and optionally from above by gas which is concurrently delivered via dispenser 8, such that a layer of treatment liquid dispersed over the back surface of a wafer W can be maintained within a controlled local environment.

Suitable gases include those which are inert to the wafer undergoing treatment and the devices and features fabricated thereon. For example, Nitrogen ($N_2$), IsoPropyl Alcohol (IPA) vapor, and combinations thereof may be provided.

Treatment liquids will depend upon the given treatment process being conducted, and generally include any treatment liquid suitable for conducting a surface treatment processes. For example, etching liquids such as diluted hydrogen fluoride (dHF) may be conducted via liquid conduit 5. Rinsing liquids such as deionized (DI) water and/or IPA also may be conducted via liquid conduit 5.

Figure 2:
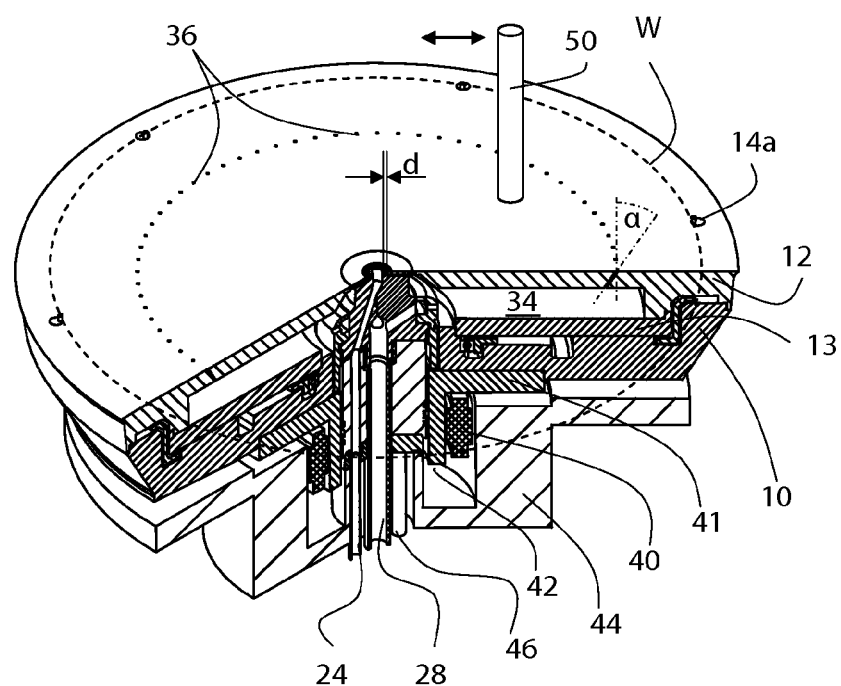
FIG. 2 is a schematic diagram of an apparatus according to an embodiment of the present invention.
Figure 3:
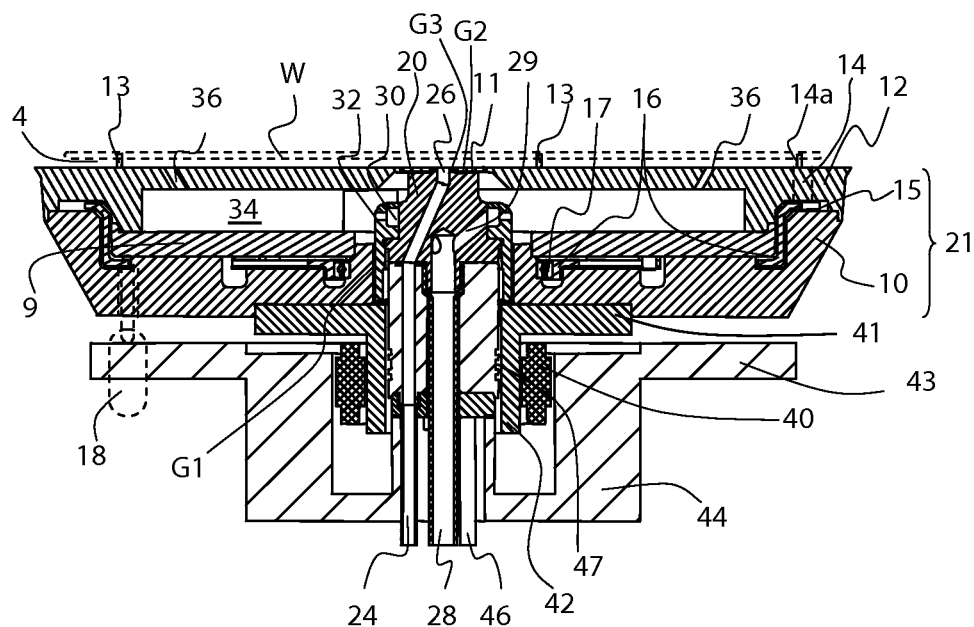
FIG. 3 is a vertical and axial cross sectional view of the apparatus of FIG. 2.

Referring to FIGS. 2 and 3, a further embodiment of the present invention comprises a spin chuck 21 for holding and rotating a wafer W and a non-rotating nozzle head 20. The spin chuck has a base body 10, which is mounted onto a rotating support plate 41.

The support plate 41 is connected to a rotating hollow shaft 42 (rotor), which is part of a hollow shaft motor 40. The hollow shaft motor has an outer stator 40 and an inner rotor. The stator 40 is connected to a machine frame part 43, 44 with a frame plate 43 and a connecting part 44. The cylinder-like non-rotating nozzle head 20 is connected to the connecting part 44.

The nozzle head 20 therefore leads through the hollow shaft 42 and the support plate 41 leaving a small gap (preferably 0.05-0.5 mm) to the inner wall of the hollow shaft 42. This gap between the hollow shaft 42 and the nozzle head 20 is sealed by an annular duct 47, which is connected to a suction device (not shown).

The base body 10 of the spin chuck, which is mounted onto the rotating support plate 41, has an inner hole leaving a small gap (preferably 0.05-0.5 mm) to the non-rotating nozzle head 20.

A cover plate 12 is mounted onto the base body 10, whereby an inwardly open gas distribution chamber 34 is generated. The cover plate 12 has a central plate 11, which is mounted to the cover plate. The central plate 11 is shaped in order to correspond to the shape of the nozzle head, wherein the central plate does not touch the nozzle head leaving a small gap G2 between the nozzle head 20 and the central plate 11 with a distance in a range of 0.05 and 0.5 mm. The inner hole of the central plate 11 corresponds to the nozzle 26 leaving a gap G3 with a distance d in a range of 0.05 and 0.5 mm.

At the bottom of the gas distribution chamber 34 a plate 13 is mounted to the base plate 10 leaving a chamber between the base plate 10 and the plate 13 for the tooth gear 16. The tooth gear 16 is rotatable connected to the base plate 10 by the bearing 17. The chamber for the tooth gear 16 thus does not have a connection to the gas distribution chamber 34.

The spin chuck 21 comprises six cylindrically shaped holding elements 14 with eccentrically mounted gripping pins 14a. The gripping pins 14a are rotated about the holding elements' cylinder axis by a tooth gear 16. The tooth gear 16 is rotated against the base-body 10 of the spin chuck by holding the tooth gear by a vertically movable rod 18 (penetrating through a not shown slit in the base-body) while slightly rotating the base-body with the hollow-shaft motor 40. Thereby the cylindrical holding elements 14 are rotated and the gripping pins 14a turn into open position. The tooth gear 16 drives the tooth gears 15, which are part of the holding elements 14. After a wafer has been placed within the gripping pins 14a, the base body is turned back and the tooth gear turns into close position driven by springs (not shown). Thereby the gripping pins 14a contact the wafer's edge and securely grip the wafer.

The nozzle head 20 comprises three lines (liquid line 24, gas line 28, and vacuum line 46), which are parallel to the rotational axis of the spin chuck. The liquid line 24 leads to the nozzle 26 for treating the wafer surface, which faces the spin chuck.

A second liquid line (not shown) may be provided as essentially the mirror image of liquid line 24, such that nozzle head 20 includes two parallel liquid lines each of which terminates at the same nozzle 26. Thus, for example, etching liquid may be directed via liquid line 24 and nozzle 26 to the back surface of a wafer during an etching process, whereas a rinsing liquid may be directed via the second liquid line and nozzle 26 during a rinsing process.

The gas line 28 is part of the non-rotating part of the gas supply line for providing gas to gap 4. In the upper part of the nozzle head the gas line 28 splits into four branches 29. The branches 29 of the gas line end in an annular non-rotating gas distribution chamber 30. The non-rotating gas distribution chamber 30 opens into the rotating gas distribution chamber 34 through twelve openings 32.

An annularly arranged plurality of gas nozzles 36 is coaxially arranged with respect to the rotational axis. Gas nozzles 36 may be oriented outwardly or inwardly relative to the rotational axis from the gas distribution chamber to the surface of the spin chuck.

More than 80% of gas, which has been supplied from the non-rotating gas distribution chamber 30 into the rotating gas distribution chamber 34, is dispensed through the openings 36 for providing gas to the gap 4 between the wafer and the cover plate 12.

The rest of the gas, which has been introduced into the rotating gas distribution chamber 34, is used for purging the gaps G1, G2, and G3 between the non-rotating nozzle head 20 and the spin chuck 21.

G1 is the gap between the nozzle head 20 and the base body 10 of the spin chuck. Gas, which has been introduced into gap G1 is removed through the annular duct 47, which is connected to the suction line 46.

G2 is the gap between the upper part of the nozzle head 20 and the lower side of the central plate 11 and G3 is the gap between the nozzle 26 and the central hole of the central plate 11.

For collecting spun off liquid a collecting chamber (annual duct—not shown) is concentrically arranged around the spin chuck. For spinning liquid into different vertically arranged annual ducts the stationary frame and the collecting chamber can be axially shifted against each other (as disclosed for instance in U.S. Pat. No. 4,903,717).

Figure 4:
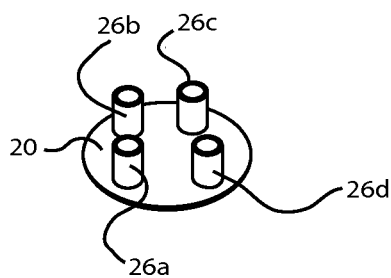
FIG. 4 depicts a plurality of liquid nozzles for use in an embodiment of the present invention.

Nozzle head 20 in FIGS. 2 and 3 may be provided in various configurations whereby one or more desired process liquids can be delivered to the back surface of a wafer undergoing treatment and a gas can be delivered to the gap formed between the back surface of the wafer and the upper surface of the spin chuck. For example, as is generally depicted in FIG. 4, nozzle head 20 may comprise plural liquid nozzles 26a-26d, each of which is fluidly connected to a corresponding liquid line, such that different process liquids can be selectively dispensed.

Figure 5:
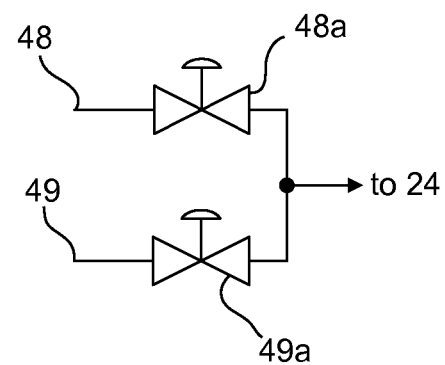
FIG. 5 depicts plural valved liquid conduits for use in an embodiment of the present invention.

Also, nozzle head 20 may comprise a liquid line 24 which is selectively fluidly connected to a plurality of process liquid supplies, such as an etchant supply and a rinse supply. For example, referring to FIG. 5, liquid supply conduit 48 includes a selectively operable valve 48a which, when open, conducts an etching liquid supply such as dHF to liquid line 24. Liquid supply conduit 49 includes a selectively operable valve 49a which, when open, conducts a rinsing liquid such as DI water to liquid line 24.

Although not depicted in the drawings, process modules of this type, even when open to the surrounding ambient, are typically closely surrounded by exhaust levels and collector levels that serve to recover liquid flung radially outwardly off of the spinning wafer, as well as to vent gasses safely away from the process module.

An example of a series of operations performed using the apparatus of FIG. 1 will now be described.

A semiconductor wafer W is positioned relative to chuck 1 so as to form a gap 4 between the wafer W and the upper surface 3 of chuck 1, after which wafer W and chuck 1 are rotated. An etching treatment of the back side of the wafer W is conducted. During the etching treatment, dHF is conducted to the back side of the wafer W via liquid nozzle 6 and a mixture of IPA in nitrogen gas is conducted to gap 4 via gas distribution chamber 34 and nozzles 36. Optionally, a mixture of IPA in nitrogen gas is concurrently conducted to the front surface of wafer W via dispenser 8.

After etching, a water rinse treatment is conducted. During the water rinse treatment, heated DI water, e.g., about 72° C., is conducted to the back side of the wafer W via liquid nozzle 6 and a mixture of IPA in nitrogen gas is conducted to gap 4 via gas distribution chamber 34 and nozzles 36. Optionally, heated DI water, e.g., about 72° C., is concurrently conducted to the front surface of wafer W via dispenser 8.

After water rinsing, an IPA rinse treatment is conducted. During the IPA rinse treatment, heated liquid IPA, e.g., about 72° C., is conducted to the back side of the wafer W via liquid nozzle 6 and a mixture of IPA in nitrogen gas is conducted to gap 4 via gas distribution chamber 34 and nozzles 36. Optionally, heated liquid IPA, e.g., about 72° C., is concurrently conducted to the front surface of wafer W via dispenser 8.

After IPA rinsing, a drying treatment is conducted. During the drying treatment, a mixture of IPA in nitrogen gas is conducted to gap 4 via gas distribution chamber 34 and nozzles 36. Optionally, a mixture of IPA in nitrogen gas is concurrently conducted to the front surface of wafer W via dispenser 8.

While the present invention has been described in connection with various illustrative embodiments thereof, it is to be understood that those embodiments should not be used as a pretext to limit the scope of protection conferred by the true scope and spirit of the appended claims.

What is claimed is:

1. A process for treating a wafer-shaped article, comprising:
    positioning a wafer-shaped article on a spin chuck in a predetermined orientation wherein a lower surface of the wafer-shaped article is downwardly-facing and spaced a predetermined distance from an upper surface of the spin chuck thereby defining a gap between the lower surface of the wafer-shaped article and the upper surface of the spin chuck;
    dispensing an etching liquid onto the lower surface of the wafer-shaped article while rotating the wafer-shaped article, from a nozzle positioned beneath a central region of the wafer-shaped article in a nozzle head that occupies a central opening of the spin chuck; and
    dispensing a gas at least to an annular region of the gap defined by the lower surface of the wafer-shaped article and the upper surface of the spin chuck, from at least one gas nozzle that rotates with the spin chuck and is positioned radially outwardly of the central opening of the spin chuck;
    wherein the steps of dispensing an etching liquid and dispensing a gas are at least partly performed concurrently.

2. The process according to claim 1, wherein the etching liquid is hydrofluoric acid.

3. The process according to claim 1, further comprising:
    dispensing a rinsing liquid onto the lower surface of the wafer-shaped article while rotating the wafer-shaped article; and
    dispensing a gas into the gap defined by the lower surface of the wafer-shaped article and the upper surface of the spin chuck.

4. The process according to claim 3, wherein the steps of dispensing a rinsing liquid and dispensing a gas are at least partly performed concurrently.

5. The process according to claim 1, wherein the at least one gas nozzle is a plurality of gas nozzles that are annularly arranged and whose outlets are positioned at least 2 cm outwardly from a central axis of the spin chuck and at least 5 mm inwardly from a peripheral edge of the wafer-shaped article.

6. The process according to claim 1, wherein the at least one gas nozzle is an annular gas nozzle whose outlet is positioned at least 4 cm outwardly from a central axis of the spin chuck and at least 1 mm inwardly from a peripheral edge of the wafer-shaped article.

* * * * *